(12) United States Patent
Takahashi

(10) Patent No.: US 8,810,112 B2
(45) Date of Patent: Aug. 19, 2014

(54) PIEZOELECTRIC DEVICES AND METHODS FOR MANUFACTURING PIEZOELECTRIC SUBSTRATES USED IN SUCH DEVICES

(75) Inventor: Takehiro Takahashi, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 236 days.

(21) Appl. No.: 13/274,220

(22) Filed: Oct. 14, 2011

(65) Prior Publication Data

US 2012/0098390 A1   Apr. 26, 2012

(30) Foreign Application Priority Data

Oct. 20, 2010 (JP) ................... 2010-235157

(51) Int. Cl.
*H03H 9/02* (2006.01)

(52) U.S. Cl.
USPC ........................................ 310/365; 310/348

(58) Field of Classification Search
CPC . H03H 9/02007; H03H 9/02047; H03H 9/05; H03H 9/0504; H03H 9/125; H03H 9/15; H03H 9/17; H03H 9/19
USPC ........................................ 310/320, 321, 348
See application file for complete search history.

(56) References Cited

U.S. PATENT DOCUMENTS

| | | | | |
|---|---|---|---|---|
| 6,087,759 | A * | 7/2000 | Pfeil | 310/321 |
| 2002/0089261 | A1* | 7/2002 | Beaver | 310/330 |
| 2005/0184625 | A1* | 8/2005 | Miyazaki | 310/348 |
| 2009/0066191 | A1 | 3/2009 | Tsuchido et al. | |

FOREIGN PATENT DOCUMENTS

| | | |
|---|---|---|
| JP | S58-146117 | 8/1983 |
| JP | 2007-243681 | 9/2007 |
| JP | 2009-118223 | 5/2009 |
| JP | 2009-260739 | 11/2009 |
| JP | 2010-154480 | 7/2010 |
| JP | 2010-200118 | 9/2010 |

OTHER PUBLICATIONS

Office Action for related China Patent Application No. 2011-10309756.0, 7 pages, dated Nov. 18, 2013.
Office Action (in Japanese) for related Japan Patent Application No. 2010-235157, 3 pages, dated Apr. 10, 2014.
Office Action (in Taiwanese) for related Taiwan Patent Application No. 100137823, 7 pages, dated May 27, 2014.

* cited by examiner

*Primary Examiner* — Derek Rosenau
(74) *Attorney, Agent, or Firm* — Klarquist Sparkman, LLP

(57) ABSTRACT

In a piezoelectric device, a piezoelectric substrate includes a vibrating piece with respective excitation electrodes on each principal surface thereof. The piezoelectric substrate is surrounded by an outer frame separated therefrom by a through-void except for a supporting portion connecting the vibrating piece to the frame. Extraction electrodes extend from the excitation electrodes across the supporting portion to the frame, and on edge surfaces of the supporting portion. The piezoelectric substrate is sandwiched between a lid and a package base to form a piezoelectric device. The outer surface of the package base is a mounting surface to which the extraction electrodes extend via an edge surface of the through-void in a region that does not overlap the excitation electrode.

16 Claims, 11 Drawing Sheets

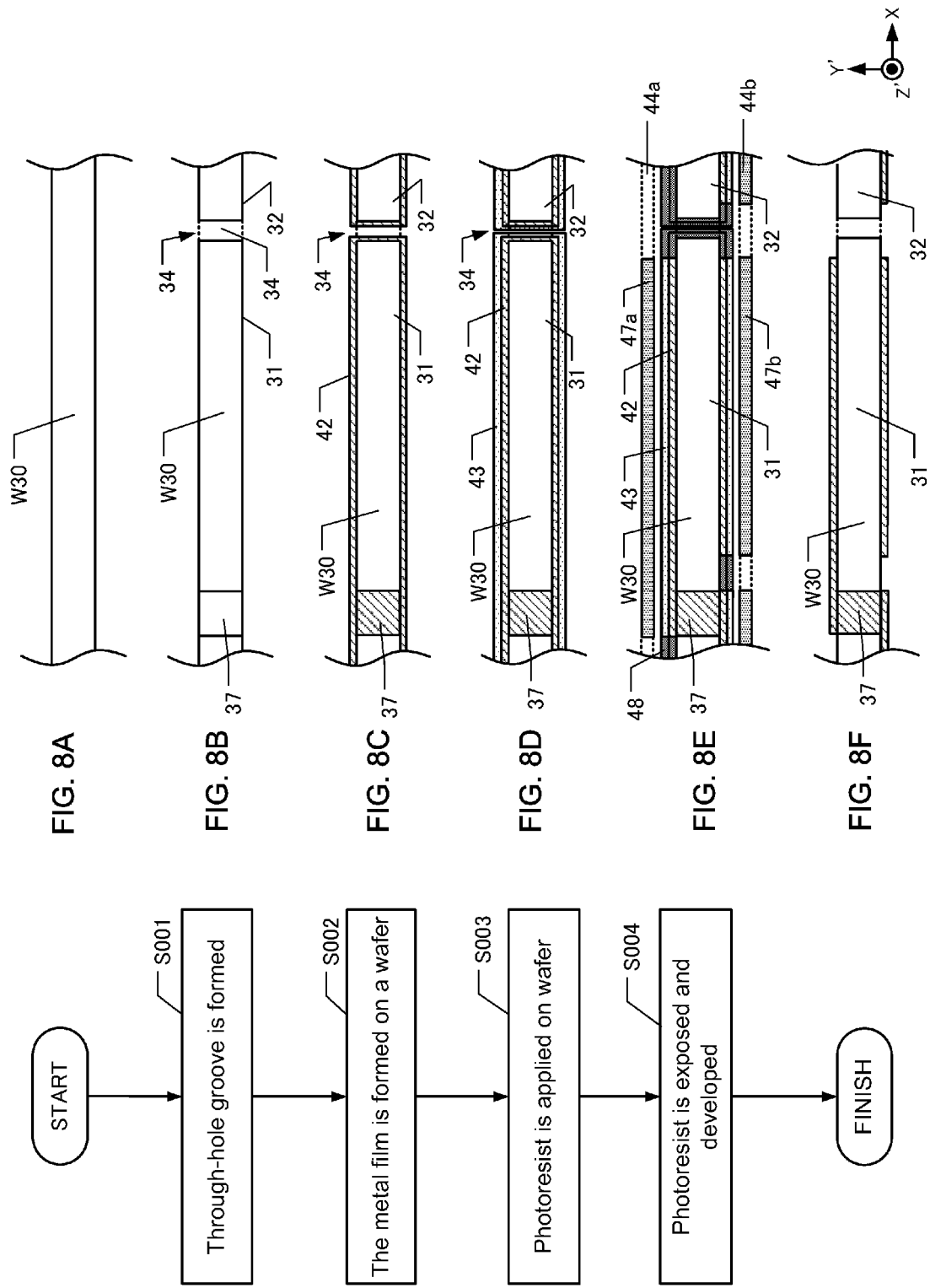

PIEZOELECTRIC DEVICES AND METHODS FOR MANUFACTURING PIEZOELECTRIC SUBSTRATES USED IN SUCH DEVICES

CROSS-REFERENCE TO RELATED APPLICATIONS

This application claims priority to and the benefit of Japan Patent Application No. 2010-235157, filed on Oct. 20, 2010, in the Japan Patent Office, the disclosure of which is incorporated herein by reference in its entirety.

FIELD

This disclosure pertains to, inter alia, piezoelectric devices in which extraction electrodes are located on an outer frame that surrounds the vibrating piece. This disclosure also pertains to methods for manufacturing piezoelectric substrates used in such devices.

DESCRIPTION OF THE RELATED ART

A conventional piezoelectric device comprises a piezoelectric substrate that includes a vibrating piece, an outer frame surrounding the vibrating piece, and a supporting portion that supports the vibrating piece relative to the outer frame. A package lid and a package base are bonded to the top surface and bottom surface, respectively, of the outer frame. This piezoelectric device can be manufactured on a mass-production scale, wherein the piezoelectric substrate, the package lid, and the package base are each formed in large quantity from respective wafers.

In Japan Unexamined Patent Document No. 2009-260739, a piezoelectric device having three (3) layers is disclosed, in which the package lid and the package base are bonded on the top and bottom surfaces of the outer frame. The edge surface of the supporting portion includes a relatively wide through-hole groove that accommodates an extraction electrode. However, by making the through-hole groove relatively wide, the width of the outer frame is correspondingly reduced, which may excessively weaken the outer frame. Also, as viewed from one edge of the vibrating piece, there is a region in which the excitation electrode and the edge surface of the extraction electrode overlap each other. Whenever there is overlap of a part of an excitation electrode and the image surface of an extraction electrode, the vibration characteristic of the vibrating piece is adversely affected, which has a negative effect on the CI (crystal impedance) of the piezoelectric device. Minimizing the area of the excitation electrode to reduce the overlap also degrades the vibration characteristic. Obtaining a stable vibration characteristic requires increasing the size of the vibrating piece and increasing the area of the excitation electrode.

SUMMARY

In view of the foregoing, this invention provides, inter alia, piezoelectric devices in which the extraction electrode is formed on a principal surface of the supporting portion and on an edge surface of a through-void, so as not to have a negative effect on the vibration characteristic of the device. This invention also provides methods for manufacturing such piezoelectric substrates.

According to one aspect of the invention, piezoelectric vibrating devices are provided. An embodiment of such a device comprises a piezoelectric substrate having first and second principal surfaces. The piezoelectric substrate includes a rectangular vibrating piece surrounded by an outer frame. The vibrating piece has a first excitation electrode on its first principal surface and a second excitation electrode on its second principal surface. The piezoelectric substrate defines a through-void extending between the vibrating piece and the outer frame so as to separate, at least in part, the vibrating piece from the outer frame. The piezoelectric substrate further includes at least one supporting portion extending between the vibrating piece and the outer frame. The supporting portion has a predefined width and extends from the outer frame to the vibrating piece to support the vibrating piece relative to the outer frame. The piezoelectric substrate further includes first and second extraction electrodes extending from the first and second excitation electrodes, respectively, across the supporting portion to the outer frame. The device also includes a package lid having an outer main surface and an inner main surface. The inner main surface is bonded to the first principal surface of the outer frame. The device further includes a package base having an inner main surface and an outer main surface. The inner main surface is bonded to the second principal surface of the outer frame, and the outer main surface is a mounting surface by which to mount the device for use. As viewed from a direction along an edge of the rectangular vibrating piece, at least one extraction electrode extends from the first principal surface to the second principal surface via an edge surface of the through-void. The edge surface is located so as not to overlap the respective excitation electrode of the vibrating piece.

In certain embodiments of the piezoelectric device of claim, the outer frame has a rectangular plan profile, and the package base comprises at least two castellations located on an edge of the package base and extending between the inner and outer main surfaces. Each castellation has a respective conductive electrode that is electrically connected to a respective extraction electrode, and the outer main surface of the package base comprises at least two external electrodes each being electrically connected to the conductive electrode of a respective castellation.

In some embodiments the supporting portion comprises a first supporting portion and a second supporting portion disposed separately from the first supporting portion and separated therefrom by a portion of the through-void. In these configurations the first and second supporting portions are located on respective corners of the vibrating piece or on a first edge thereof.

In some embodiments the supporting portion comprises a first supporting portion and a second supporting portion disposed separately from the first supporting portion and separated therefrom by a portion of the through-void. In these configurations the first and second supporting portions are located on diagonally opposing corners of the rectangular vibrating piece.

The outer frame has a width that desirably is predefined. Similarly, the through-void has a predefined width that is a minimum width that can be formed depth-wise by wet-etching from the first principal surface to the second principal surface. In these configurations the width of the through-void is usually less than the width of the outer frame.

In some embodiments the first external electrode extends from the first principal surface to the second principal surface via an edge surface of the through-void. The second extraction electrode can extend along the second principal surface to the outer frame, wherein the first extraction electrode is shorter than the second extraction electrode.

According to another aspect of the invention, methods are provided for manufacturing a piezoelectric substrate. In an embodiment of such a method, on a wafer made of a piezoelectric material, a through-void is formed having a predefined width. The through-void at least partially surrounds a rectangular vibrating piece and separates the vibrating piece from an outer frame. The through-void is bridged in at least one location by a respective supporting portion extending from the outer frame to the vibrating piece to support the vibrating piece relative to the outer frame. On the wafer, a metal film is formed on a first principal surface of the wafer, on an opposing second principal surface of the wafer, and on an edge surface of the through-void. A layer of photoresist is formed on the metal film on the first and second principal surfaces of the wafer. The photoresist on the first and second principal surfaces of the vibrating piece is exposed through a mask defining respective patterns for excitation electrodes and extraction electrodes, so as to form a respective excitation electrode on each principal surface of the vibrating piece, with a respective extraction electrode for each excitation electrode extending from the respective excitation electrode across the supporting portion to the outer frame. The mask defines the excitation electrodes and extraction electrodes so that, as viewed from a direction along an edge of the rectangular vibrating piece, at least one extraction electrode extends from the first principal surface to the second principal surface via an edge surface of the through-void. The edge surface is located so as not to overlap the respective excitation electrode of the vibrating piece.

The photoresist can be a positive photoresist from which the mask blocks exposure light irradiated onto the edge surface that does not overlap the respective excitation electrode of the vibrating piece. Alternatively, the photoresist is a negative photoresist that, in the edge surface located so as not to overlap the respective excitation electrode of the vibrating piece, is exposed by exposure light irradiated onto a corresponding opening in the mask.

In certain embodiments of the method, the supporting portion comprises a first supporting portion and a second supporting portion disposed apart from the first supporting portion and separated therefrom by the through-void. The extraction electrode extending via the edge of the through-void extends only on one principal surface of the first supporting portion or second supporting portion.

The present disclosure provides, inter alfa, piezoelectric devices and methods for their manufacture. A piezoelectric substrate includes an extraction electrode formed on the outer frame surrounding the vibrating piece. The extraction electrode is formed so as to prevent the vibration characteristic of the vibrating piece from being adversely affected, and allows the vibrating piece to be relatively large.

BRIEF DESCRIPTION OF THE DRAWINGS

FIG. 8 is a flow-chart of an embodiment of a method for manufacturing a piezoelectric substrate.

DETAILED DESCRIPTION

Various representative embodiments are described below with reference to the respective drawings. It will be understood that the scope of the disclosure is not limited to the described embodiments, unless otherwise stated.

First Embodiment of a Piezoelectric Device

Figure 1:
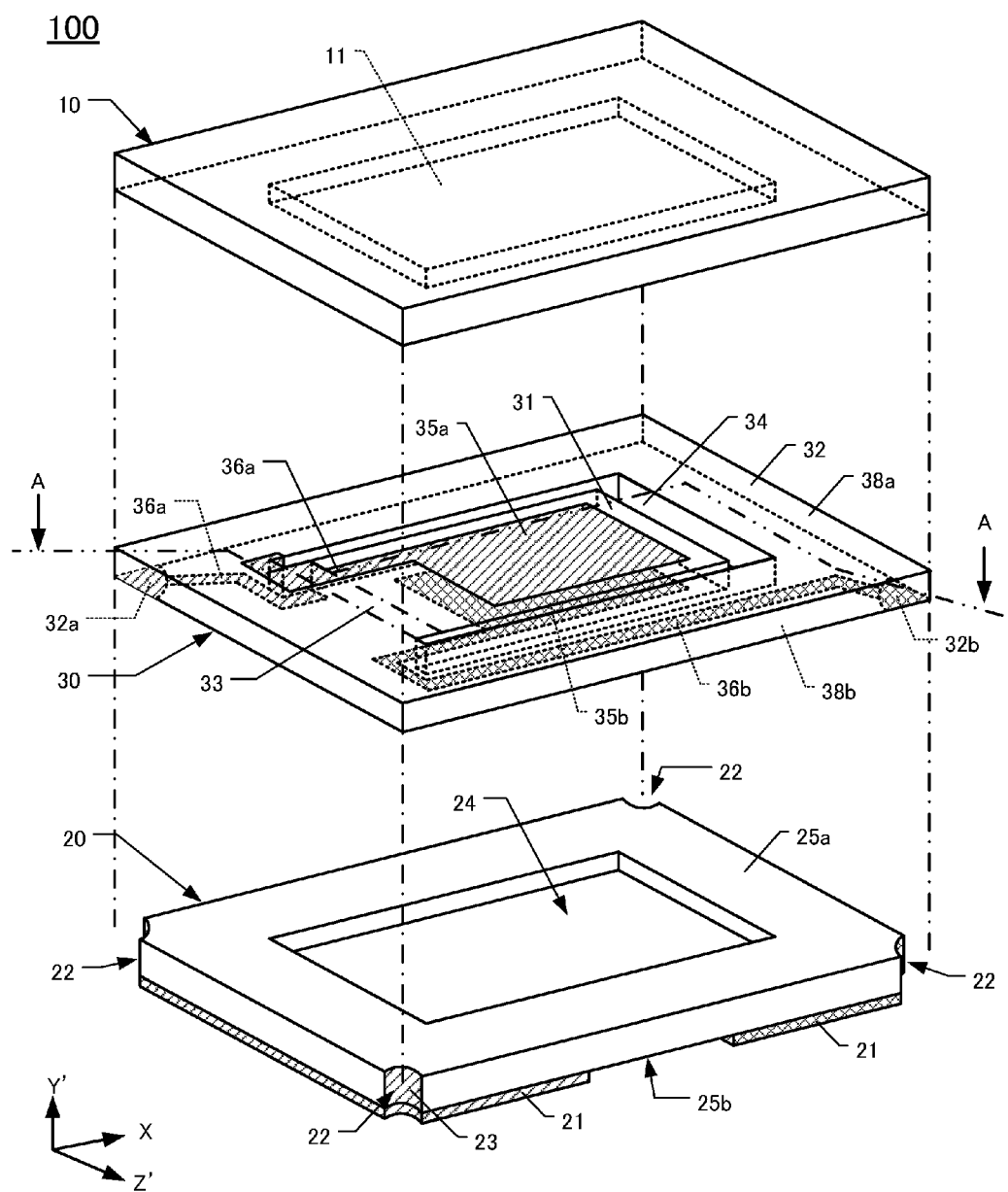
FIG. 1 is an exploded perspective view of a first embodiment of a piezoelectric device.

FIG. 1 is an exploded perspective view of a first embodiment of a piezoelectric device 100. The device 100 comprises a package lid 10, a package base 20, and a piezoelectric substrate 30. The piezoelectric substrate 30 is fabricated from an AT-cut quartz-crystal material, for example. An AT-cut quartz-crystal material has a principal surface (in the YZ plane) that is tilted by 35° 15' about the Y-axis of a crystal-coordinate system (XYZ) in the direction of the Y-axis from the Z-axis around the X-axis. Thus, in the following description, new axes tilted with respect to the axial directions of the quartz-crystal material are denoted as the Y'-axis and Z'-axis, respectively. Therefore, in the piezoelectric device 100, the longitudinal direction of the piezoelectric device is the X-axis direction, the height direction is the Y'-axis direction, and the direction that is perpendicular to the X-axis direction and Y'-axis direction is the Z'-axis direction.

The piezoelectric substrate 30 comprises a rectangular vibrating piece 31 and an outer frame 32 surrounding the vibrating piece 31. Between the vibrating piece 31 and the outer frame 32 is a through-void 34 extending through the thickness dimension (Y'-axis direction) of the piezoelectric substrate 30. The through-void 34 has a predefined width and extends around most of the vibrating piece to separate the vibrating piece, at least in part, from the outer frame 32. A supporting portion 33 is situated on the −X-axis side of the vibrating piece 31 and is region of the piezoelectric substrate where the through-void 34 is not present. The supporting portion 33 connects the vibrating piece 31 to the outer frame 32 and supports the vibrating piece 31 relative to the outer frame thereof.

The piezoelectric substrate 30 includes two principal surfaces. A first principal surface 38a is located on the +Y'-side of the substrate, and a second principal surface 38b is located on the −Y'-side. A first excitation electrode 35a is formed on the first principal surface 38a, and a second excitation electrode 35b is formed on the second principal surface 38b. A first extraction electrode 36a extends from the first excitation electrode 35a across the supporting portion 33 and an edge-surface thereof to a first corner 32a of the second principal surface 38b of the outer frame 32. A second extraction electrode 36b extends from the second excitation electrode 35b across the supporting portion 33 to a second (and diametrically opposed) corner 32b of the second principal surface 38b of the outer frame 32. The piezoelectric substrate 30 is bonded to an inner main surface of the package lid 10 via the first principal surface 38a of the outer frame 32, and bonded to the inner main surface of the package base 20 via the second principal surface 38b of the outer frame 32.

The package base 20 comprises an inner main surface 25a situated on the +Y'-side surface of the package base 20. The inner main surface 25a is bonded to the second principal surface 38b of the outer frame 32. An outer main surface (also called mounting surface) 25b of the package base is opposite the inner main surface 25a. The outer main surface 25b includes two external electrodes 21. On each corner of the package base 20 is a respective castellation 22 that extends between the inner main surface 25a and the mounting surface 25b. The surface of each castellation 22 includes a respective conduction electrode 23. The conduction electrodes 23 of two castellations 22 are electrically connected to one external electrode 21, and the conduction electrodes 23 of the remaining two castellations 22 are electrically connected to the other external electrode 21. The inner main surface of the package base 20 defines a recess 24. The inner main surface (−Y'-side surface) of the package lid 10 is bonded to the first principal surface 38a of the outer frame 32. The inner main surface of the package lid 10 defines a recess 11. Thus, when the device 100 is fully assembled, the vibrating piece 31 of the piezoelectric device 100 is situated inside a cavity 41 (see FIG. 2A) defined in part by the recesses 11 and 24.

Figure 2A:
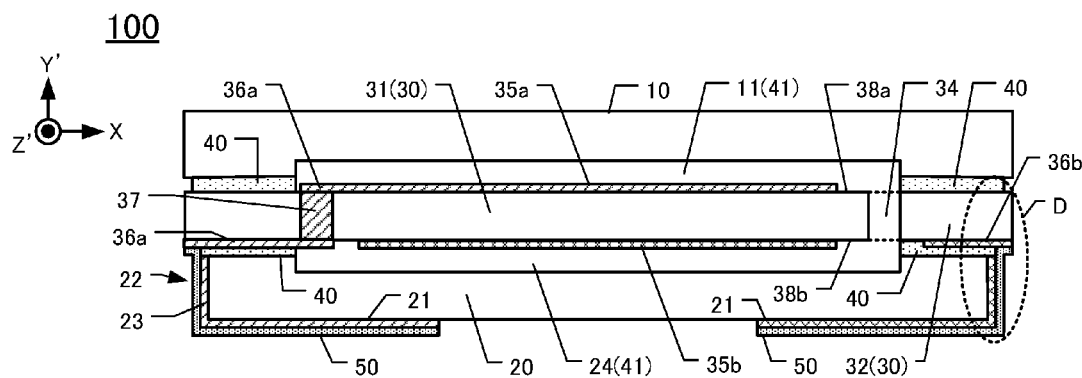
FIG. 2A is an elevational section of the piezoelectric device of FIG. 1.

FIG. 2A is an elevational section, along the line A-A in FIG. 1, of the piezoelectric device 100. The package lid 10 and the piezoelectric substrate 30, and the piezoelectric substrate 30 and the package base 20, are bonded together peripherally using a sealing material 40. The sealing material 40 comprises an adhesive made of low-melting-point glass, epoxy resin, or polyimide resin. After bonding together the package base 20 and the piezoelectric substrate 30, a respective surface electrode 50 is formed on the outer surface of each external electrode 21 and thus is connected to the respective castellations 22. The surface electrode 50 is made by sputtering or non-electrolytic plating. The surface electrodes 50 provide electrical connection of the respective external electrodes 21 to the respective conductive electrodes 23 and to the respective extraction electrodes 36a, 36b. The first extraction electrode 36a is connected to an electrode-extracting conductor 37, which is situated on a part of the edge surface of the through-void 34. The electrode-extracting conductor 37 connects together a first portion of the first extraction electrode 36a on the first principal surface 38a to a second portion of the first extraction electrode 36a on the second principal surface 38b.

Figure 2B:
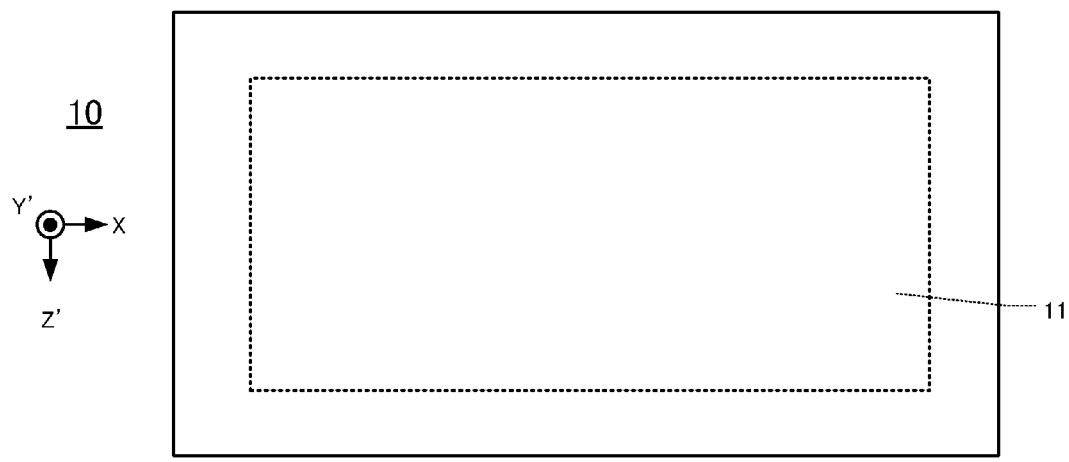
FIG. 2B is a plan view of the package lid used in the first embodiment.

FIG. 2B is a plan view of the outer main surface of the package lid 10, showing its rectangular profile. The opposing inner main surface (facing the −Y'-direction) defines a recess 11. The peripheral regions of the recess 11 are bonded to the first principal surface 38a of the outer frame 32 using the sealing material 40.

Figure 2C:
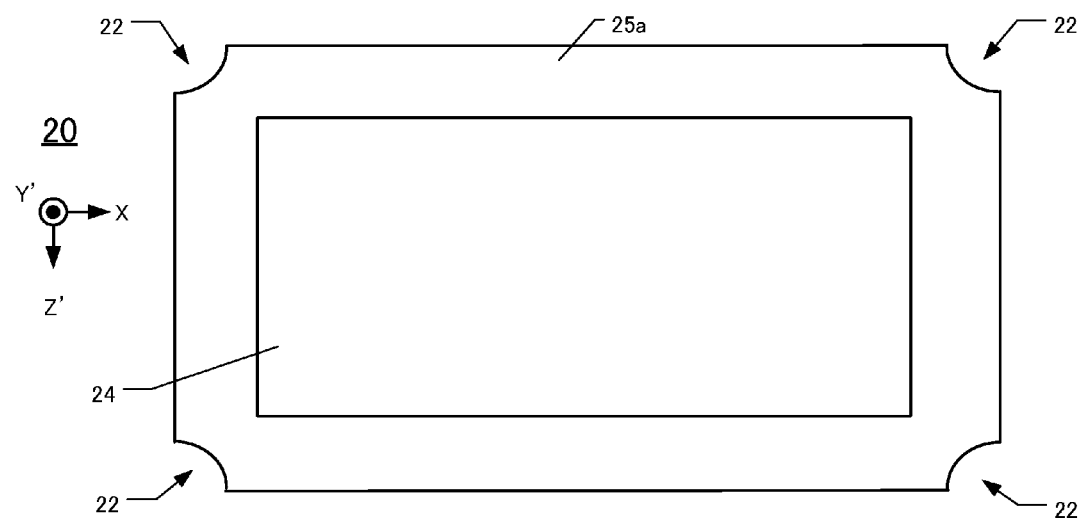
FIG. 2C is a plan view of the package base 20 used in the first embodiment.

FIG. 2C is a plan view of the inner main surface of the package base 20, showing its rectangular profile. Each corner includes a respective castellation 22. On each castellation 22 is a respective conductive electrode 23 (FIG. 2A). The inner main surface 25a (facing the +Y'-direction) of the package base 20 defines a rectangular recess 24. Regions of the inner main surface 25a that are peripheral to the recess 24 are bonded to the second principal surface 38b of the outer frame 32.

Piezoelectric Substrate and the Alternative Configurations Thereof

The piezoelectric substrate 30 can have any of various configurations. Described below are the piezoelectric substrate 30 and various exemplary alternative configurations 30a-30f thereof.

Figure 3A:
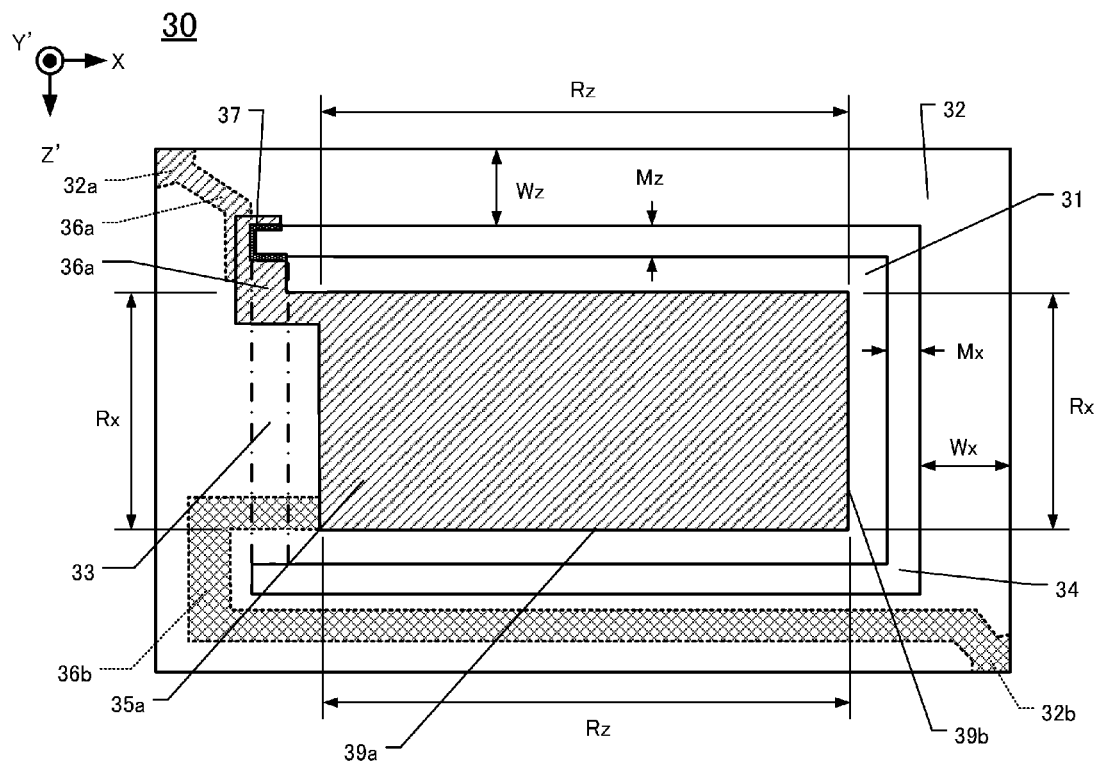
FIG. 3A is a plan view of the piezoelectric substrate 30 used for fabricating the first embodiment.

FIG. 3A is a plan view of the piezoelectric substrate 30 as viewed from above its first principal surface. A first extraction electrode 36a extends from the first excitation electrode 35a, across the supporting portion 33 (the region denoted by dot-dash line), down the electrode-extracting conductor 37, to the corner 32a of the outer frame 32. A second extraction electrode 36b extends from the second excitation electrode 35b, across the supporting portion 33 to the corner 32b of the outer frame 32. The first extraction electrode 36a is shorter than the second extraction electrode 36b. The width of the outer frame 32 in the Z'-axis direction is denoted Wz, and the width of the outer frame 32 in the X-axis direction is denoted Wx, wherein Wz=Wx in this embodiment. Also, the width of the void 34 in the Z'-axis direction is denoted Mz, and the width of the void in the X-axis direction is denoted Mx, wherein Mz=Mx in this embodiment. The edges of the first excitation electrode 35a and second excitation electrode 35b extending in the X-axis direction are denoted first edges 39a, and the corresponding edges extending in the Z'-axis direction are denoted second edges 39b. The length of the first edge 39a is denoted Rz, and the length of the second edge 39b is denoted Rx. Rz and Rx are as large as possible to maximize the dimensions of the vibrating piece 31 in the X-axis direction and Z'-axis direction, which produces a stable vibration frequency.

When the piezoelectric substrate 30 is viewed from the Z'-direction, the electrode-extracting conductor 37 does not overlap the first edge 39a of the excitation electrode 35a. Also, when the piezoelectric substrate 30 is viewed from the X-axis direction, the electrode-extracting conductor 37 does not overlap the second edge 39b of the excitation electrode 35a. If the electrode-extracting conductor 37 were to overlap the first edge 39a or the second edge 39b, then vibration produced by the piezoelectric substrate may be adversely affected.

The piezoelectric substrate 30 provides a stable vibration frequency by providing a relatively large vibrating piece 31 with correspondingly large excitation electrodes 35a, 35b. Therefore, the through-void 34 desirably is relatively small compared to the vibrating piece 31. The through-void 34 desirably is formed by depth-wise wet-etching or sand-blasting. Considering the great hardness of many piezoelectric substrates 30, the through-void desirably has a predefined width.

The electrode-extracting conductor 37 is essentially a bridging portion of the first extraction electrode 36a that comprises a metal film situated on an edge surface of the through-void 34. This location increases the difficulty of forming the conductor 37 by sputtering or vacuum-deposition. As a result, the metal film in the conductor 37 tends to be thinner than desired. This may cause the electrical resistivity of the first extraction electrode 36a to be greater than the electrical resistivity of the second extraction electrode 36b. By making the first extraction electrode 36a (including the electrode-extracting conductor 37) shorter than the second extraction electrode 36b, any difference in electrical resistivity of the first extraction electrode 36a relative to the second extraction electrode 36b can be reduced.

Although the package base 20 includes castellations 22, they are not provided on the piezoelectric substrate 30. If the castellations were to be formed on the piezoelectric substrate, then their size would have to be considered when making positional alignments during bonding. If each castellation were to be formed relatively large, then its resistance to physical shock would be correspondingly reduced. The absence of castellations on the piezoelectric substrate 30 increases its durability against physical shock. Also, since the length of the connection between the vibrating piece 31 and the outer frame 32 via the supporting portion 33 is greater in this embodiment than in various alternative configurations thereof, the piezoelectric substrate 30 of this embodiment tends to be more durable and more resistant to physical shock.

Figure 3B:
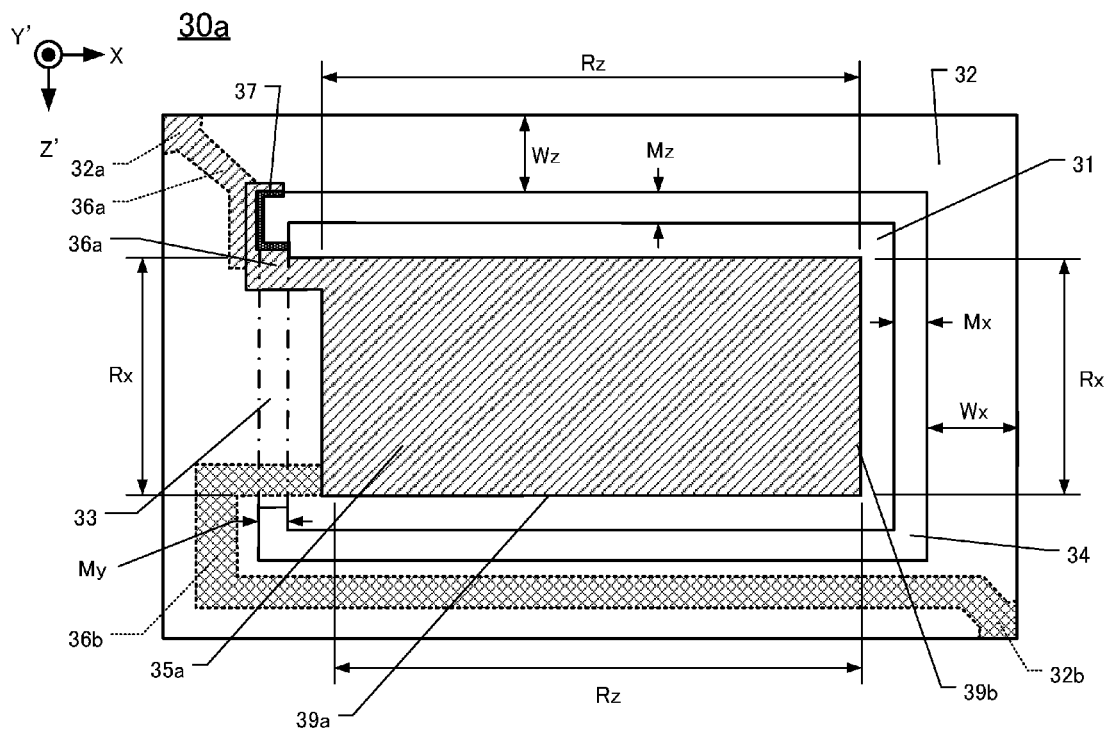
FIG. 3B is a plan view of a first alternative configuration of the piezoelectric substrate.

FIG. 3B is a plan view of a first alternative configuration 30a of the piezoelectric substrate 30. In this configuration 30a the supporting portion 33 is shorter in the Z'-axis direction than in the piezoelectric substrate 30 of the FIG.-3A embodiment. As a result, the through-void 34 of this configuration 30a is longer than in the FIG.-3A embodiment. In this configuration 30a, Mz=Mx. By reducing the length of the supporting portion 33 in the Z'-axis direction in the FIG.-3B configuration, the piezoelectric substrate 30a better confines the vibration energy generated in the vibrating piece 31, which desirably reduces the CI. Also, the reduced length of the supporting portion 33 in the Z'-axis direction allows enlargement of the region in which the electrode-extracting conductor 37 is formed, which allows reduction of the electrical resistance of the extracting electrodes 36a connected to the electrode-extracting conductor 37.

Figure 4A:
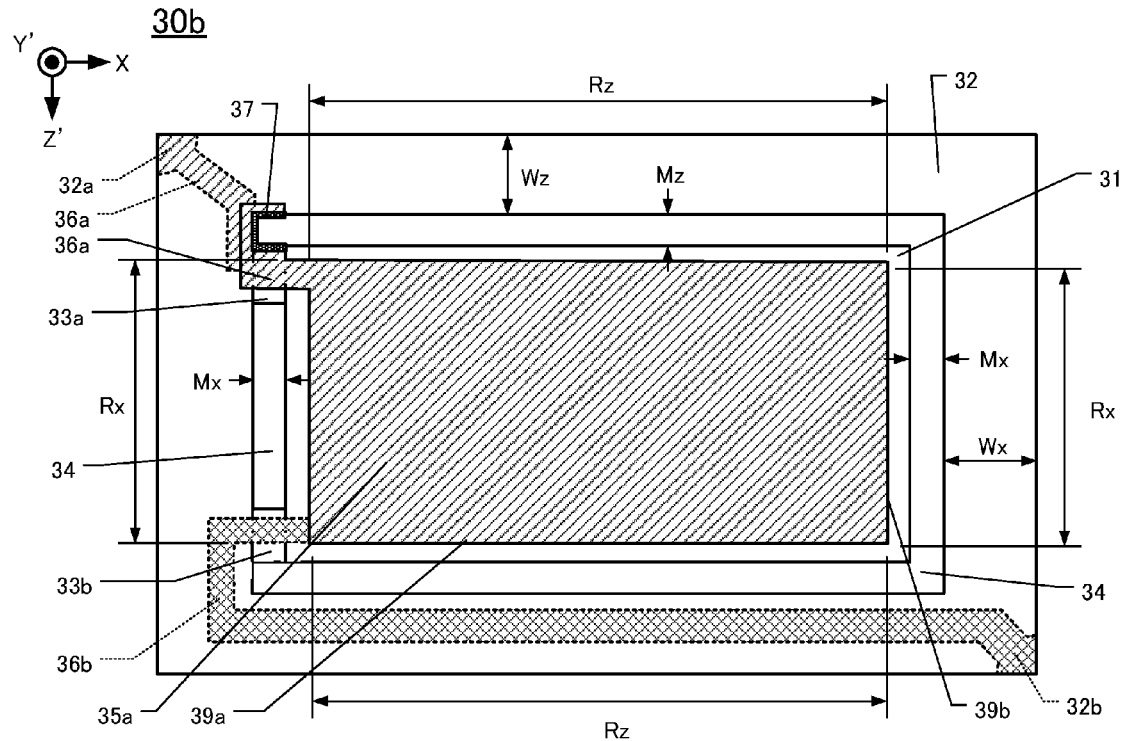
FIG. 4A is a plan view of a second alternative configuration of the piezoelectric substrate.

FIG. 4A is a plan view of a second alternative configuration 30b of the piezoelectric substrate 30 of the FIG.-3A embodiment. In this configuration 30b, the vibrating piece 31 is supported by two supporting portions 33a, 33b spaced apart in the Z'-direction. The first extraction electrode 36a is situated on the first supporting portion 33a, and the second extraction electrode 36b is situated on the second supporting portion 33b. On the piezoelectric substrate 30b, the through-void 34 (having width Mx=Mz) also extends between the first supporting portion 33a and the second supporting portion 33b. This configuration 30b, by reducing the distance between the vibrating piece 31 and the supporting regions 33a, 33b, tends to isolate the vibration energy in the vibrating piece 31 better than the piezoelectric substrate 30 of the first embodiment. Better isolation of vibration energy reduces the CI of the device.

The electrode-extracting conductor 37 is effectively a bridging portion of the first extraction electrode between the first and second principal surfaces of the piezoelectric substrate 30b. When the piezoelectric substrate 30b is viewed along the Z'-axis, the electrode-extracting conductor 37 does not overlap the first edge 39a of the excitation electrode 35a. Also, when the piezoelectric substrate 30 is viewed along the X-axis, the conductor 37 does not overlap the second edge 39b of the excitation electrode 35a.

Figure 4B:
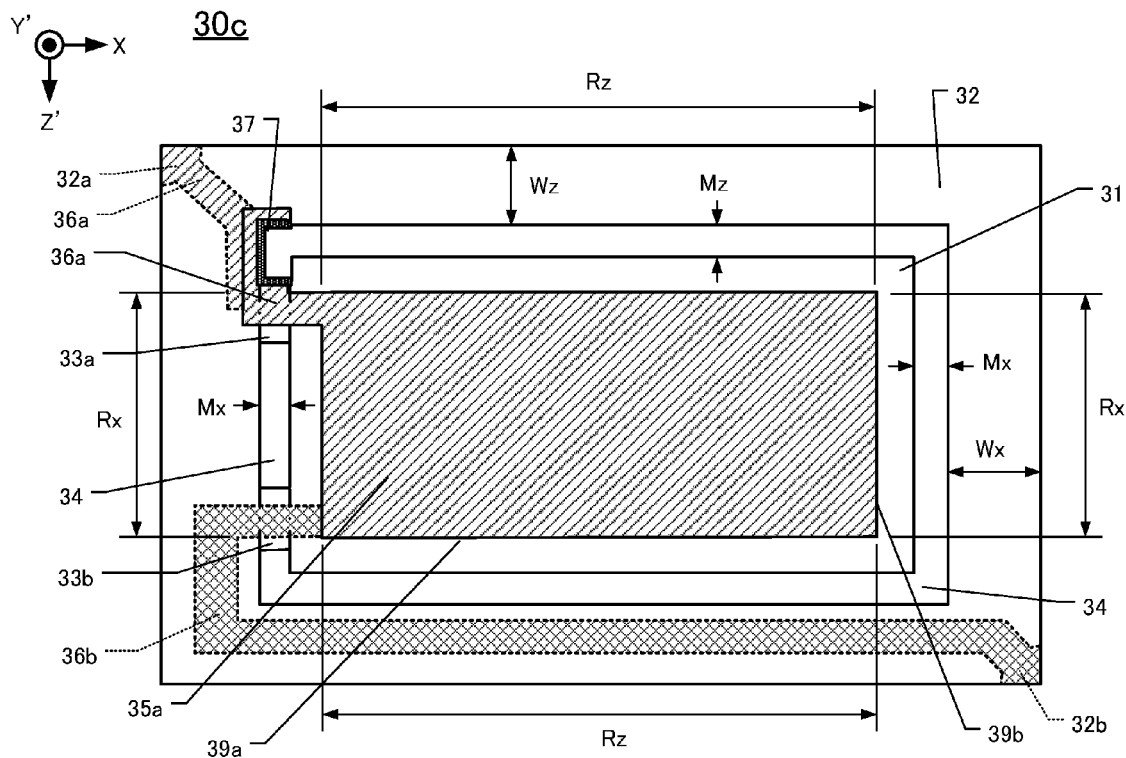
FIG. 4B is a plan view of a third alternative configuration of the piezoelectric substrate.

FIG. 4B is a plan view of a third alternative configuration 30c of the piezoelectric substrate 30 of the FIG.-3A embodiment. In this configuration 30c, the first supporting portion 33a is shifted in the +Z'-axis direction toward the second supporting portion 33b, and the second supporting portion 33b is shifted in the −Z'-axis direction toward the first supporting portion 33a, compared to the configuration 30b of FIG. 4A. Therefore, as shown in FIG. 4B, the region in which the electrode-extracting conductor 37 can be formed is further increased, which allows greater width of the conductor 37 and corresponding reduction of the electrical resistance of the extraction electrode 36a in the FIG.-4B configuration relative to the FIG.-4A embodiment.

The electrode-extracting conductor 37 is effectively a bridging portion of the first extraction electrode between the first and second principal surfaces of the piezoelectric substrate 30c. When the piezoelectric substrate 30c is viewed along the Z'-axis, the electrode-extracting portion 37 does not overlap the first edge 39a of the excitation electrode 35a. Also, when the piezoelectric substrate 30 is viewed along the X-axis, the conductor 37 does not overlap the second edge 39b of the excitation electrode 35a.

Figure 5A:
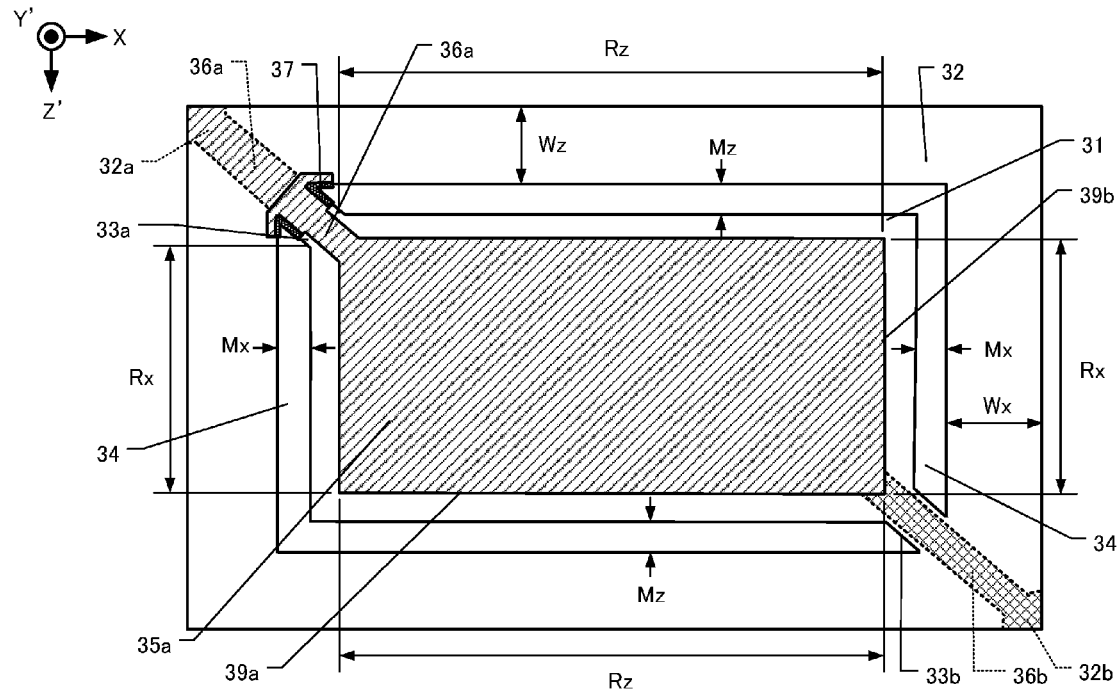
FIG. 5A is a plan view of a fourth alternative configuration of the piezoelectric substrate.

FIG. 5A is a plan view of a fourth alternative configuration 30d of the piezoelectric substrate. In this configuration 30d, first and second supporting portions 33a, 33b, respectively, join respective corners of the vibrating piece 31 to respective inner corners of the outer frame 32. The supporting portions 33a, 33b are disposed diagonally relative to the vibrating piece 31. Whenever the piezoelectric substrate 30d is viewed along the Z'-axis, the first extraction electrode 36a of the electrode-extracting conductor portion 37 does not overlap the first edge 39a of the excitation electrode 35. Similarly, whenever the piezoelectric substrate 30 is viewed along the X-axis, the first extraction electrode 36a does not overlap the second edge 39b of the excitation electrode 35. In this configuration 30d, the electrode-extracting conductor 37 desirably is situated on both sides of the first supporting portion 33a, which provides a larger region in which to locate the electrode-extracting conductor 37. This configuration of the piezoelectric substrate 30d has greater rigidity than, for example, the piezoelectric substrate 30b, in which the first and second supporting portions 33a and 33b are on the same side as the vibrating piece 31.

Figure 5B:
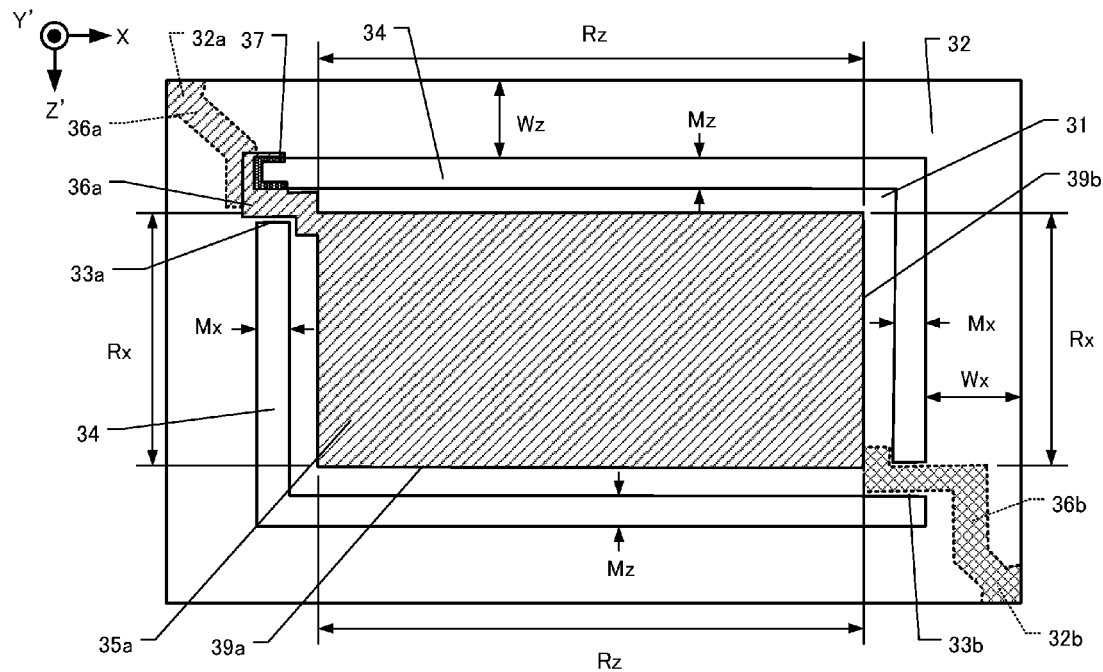
FIG. 5B is a plan view of a fifth alternative configuration of the piezoelectric substrate.

FIG. 5B is a plan view of yet another alternative configuration 30e of the piezoelectric substrate, in which the first and second supporting portions 33a and 33b are disposed diagonally relative to the vibrating piece 31. Also, the supporting portions extend parallel to the X-axis. In this configuration, the through-void 34 does not have sharp corners on the electrode-extracting conductor 37, compared to the piezoelectric substrate 30d, which allows the through-void 34 to be formed more easily by etching or sand-blasting. Also, the first extraction electrode 36a can be formed more easily having a predetermined thickness on the electrode-extracting conductor 37.

Figure 6:
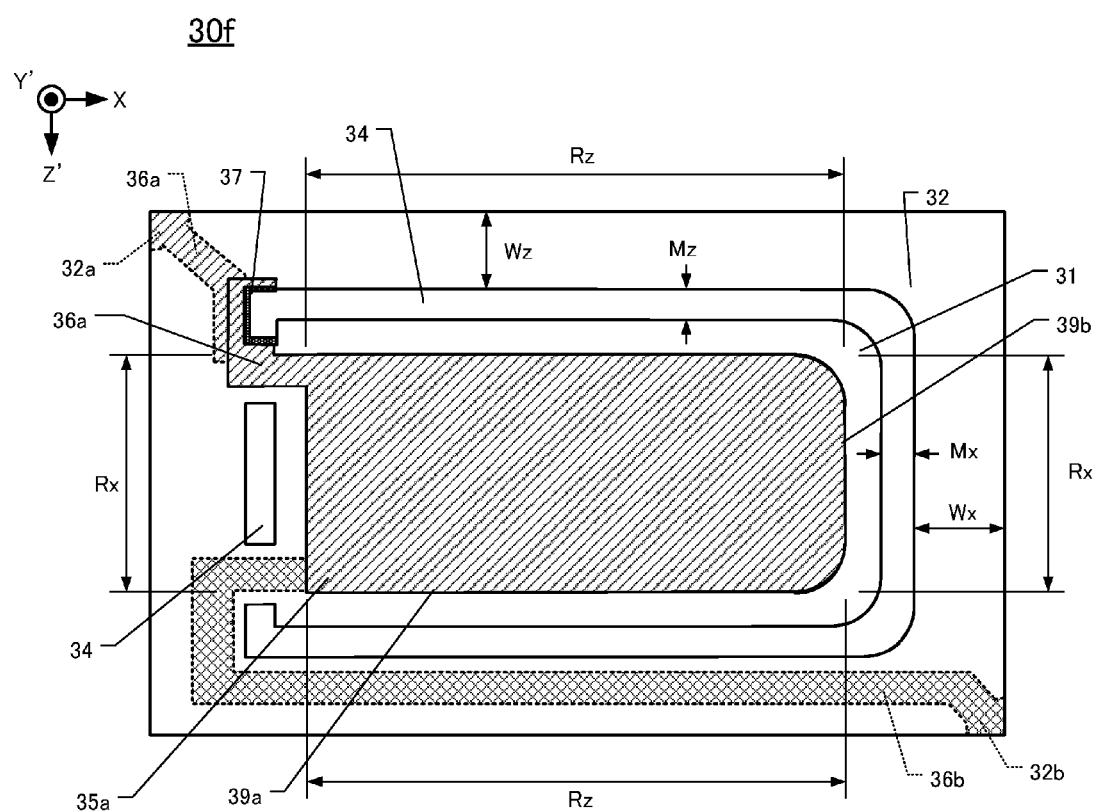
FIG. 6 is a plan view of a sixth alternative configuration of the piezoelectric substrate.

FIG. 6 is a plan view of yet another alternative configuration 30f of the piezoelectric substrate, in which a portion of the through-void 34 is curved, thereby producing rounded corners of the vibrating piece 31. Also, Mz=Mx, and the electrode-extracting conductor 37 does not overlap the first edge 39a and the region extending in the Z'-directions. The electrode-extracting conductor 37 also does not overlap the second edge 39b and the region extending along the X-axis directions. The vibrating piece 31, excitation electrode 35, and through-void 34 can all be formed with the depicted curved edges. As shown in FIG. 6, by forming a corner of the outer frame 32 (disposed on edges of the through-void 34) with curves, the thickness of the corner of the outer frame 32 can be increased, thereby rigidifying the outer frame 32.

Methods for Bonding the Piezoelectric Substrate and Package Base

The piezoelectric substrate and the package base can be bonded together by any of various methods. The shape of the electrode formed on the package base or the method in which the electrode was formed may dictate the bonding method.

Figure 7A:
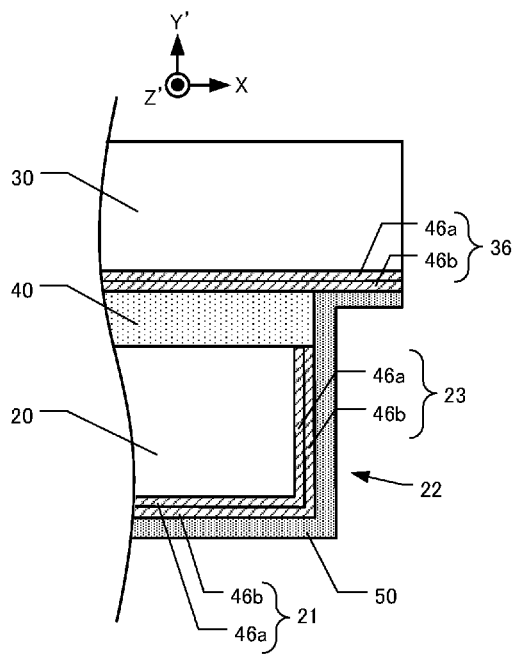
FIG. 7A is an enlargement of the region encircled by the dotted line D in FIG. 2A.

FIG. 7A is an enlarged view of the region in FIG. 2A that is encircled by a dotted line D. The electrode 36 formed on the piezoelectric substrate 30 and the package base 20 comprises a chromium (Cr) layer 46a and a gold (Au) layer 46b. The chromium layer 46a is a foundation layer formed on the piezoelectric substrate 30 and the package base 20. The gold layer 46b is formed on the chromium layer 46a. The chromium layer 46a allows the metal layers to be bonded with higher strength to the piezoelectric substrate 30 and the package base 20, and the gold layer 46b prevents the chromium layer 46a from oxidizing or otherwise experiencing an increase in electrical resistance. The piezoelectric substrate 30 and the package base 20 are bonded together using the sealing material 40. The sealing material 40 comprises an adhesive made of low-melting-point glass, epoxy resin, or polyimide resin. After bonding, a first surface electrode 50 is formed by sputtering or non-electrolytic plating on the external electrode 21 and castellations 22. Thus, the first surface 50 is formed on selected regions of the first surface of the extraction electrode 36, the external electrode 21, and the conductive electrode 23 to electrically connect these components together.

Figure 7C:
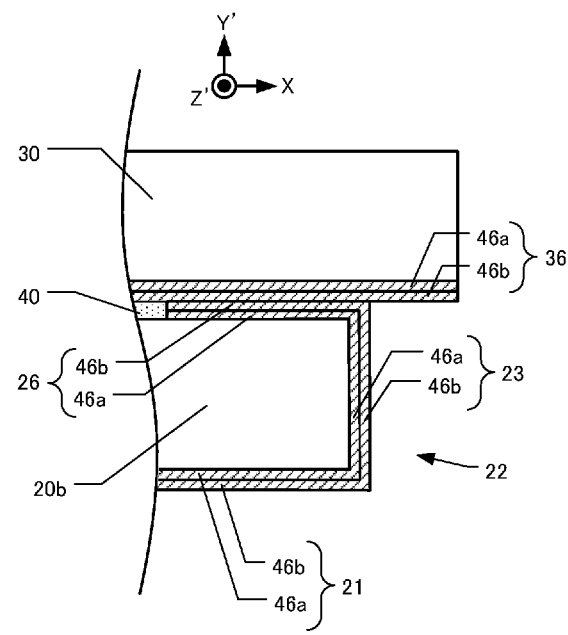
FIG. 7C is an enlargement of the region in which the piezoelectric substrate and the package base of the piezoelectric device are bonded together.
Figure 7B:
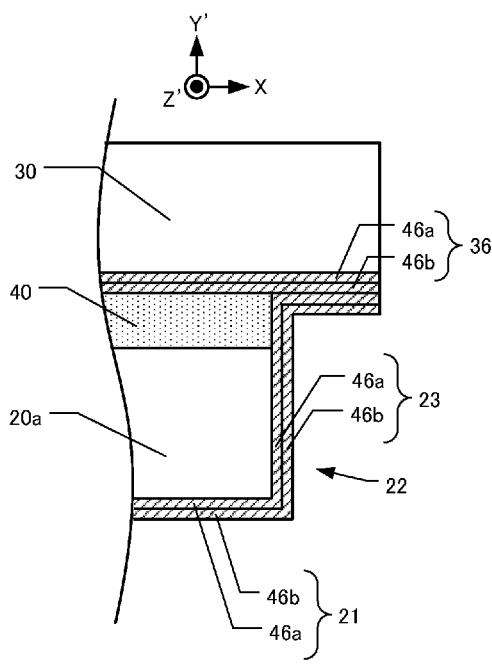
FIG. 7B is an enlargement of the region in which the piezoelectric substrate and the package base are bonded together.

FIG. 7B is an enlarged view of another bonding region of the piezoelectric substrate 30 and the package base 20a. In FIG. 7B, the piezoelectric substrate 30 and the package base 20a are bonded together using the sealing material 40. At this point in fabrication, although the extraction electrode 36 is formed on the piezoelectric substrate 30, the respective electrodes (e.g., the external electrode 21 and conductive electrode 23) are not yet formed on the package base 20a. After bonding together the piezoelectric substrate 30 and the package base 20a, the chromium layer 46a and the gold layer 46b are formed (by sputtering) in locations corresponding to the external electrode 21 and the castellations 22. The chromium layer 46a and gold layer 46b form the external electrode 21 and the conductive electrode 23. Since the chromium layer 46a and the gold layer 46b are formed simultaneously on the surface of the extraction electrode 36, the external electrode 21, the conductive electrode 23, and the extraction electrode 36 are electrically connected to each other.

FIG. 7C is an enlarged view of another example of the bonding region of the piezoelectric substrate 30 and the package base 20b. In this example, the extraction electrode 36 and the connecting electrode 26 contact each other. On the package base 20b, the connecting electrode 26 is formed on the external electrode 21, the conductive electrode 23, and the inner main surface 25a to electrically connect these components together. The package base 20b and the piezoelectric substrate 30 are in electrical contact via the connecting electrode 26 and the extraction electrode 36 that electrically connect these components together.

Figure 7D:
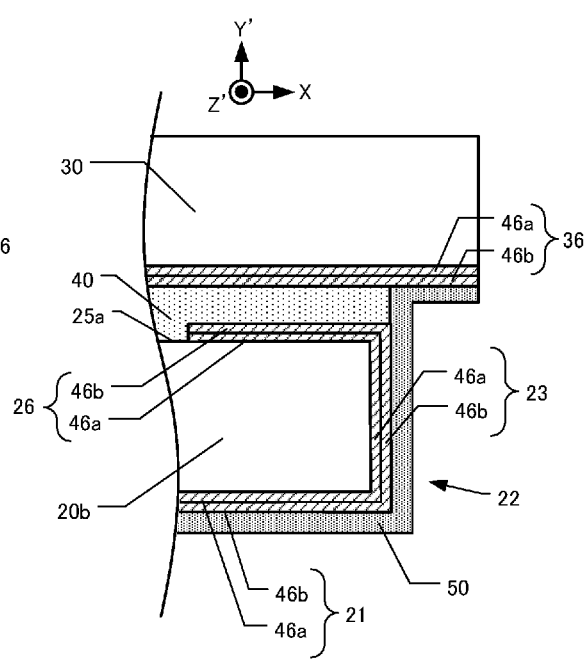
FIG. 7D is an enlargement of the region in which the piezoelectric substrate and the package base are bonded together.

FIG. 7D is an enlarged view of another example off the bonding region of the piezoelectric substrate 30 and the package base 20b. In this example, the extraction electrode 36 and the connecting electrode 26 are not in direct contact with each other, which is different from the configuration of these features in FIG. 7C. In FIG. 7D, the extraction electrode 36 and the external electrode 21 are in electrical contact with each other as a result of bonding together the piezoelectric substrate 30 and the package base 20b using the sealing material 40 and forming the first surface electrode 50 on the external electrode 21 and the castellations 22. In FIG. 7C, even if the extraction electrode 36 and the connecting electrode 26 contact each other directly, formation of product rendered defective by disconnection of the extraction electrode 36 and connecting electrode 26 from each other can be prevented by forming the first surface electrode 50.

Embodiment of Method for Manufacturing the Piezoelectric Substrate

Multiple piezoelectric substrates 30 can be manufactured simultaneously by forming respective sets of through-voids 34, excitation electrodes 35, and extraction electrodes 36 on a piezoelectric wafer W30. Formation of the through-voids 34, the excitation electrodes 35, and the extraction electrodes 30 on the piezoelectric substrate 30 is described with reference to FIG. 8.

FIG. 8 is a flow-chart showing these manufacturing steps as performed on the piezoelectric substrate 30. FIGS. 8A-8F are respective elevational sections depicting the results of respective steps in the flow-chart. FIGS. 8A-8F depict the piezoelectric wafer W30 along the line A-A in FIG. 1. This cross-section is along the same line as the section of the piezoelectric substrate 30 shown in FIG. 2.

In step S001 the through-voids 34 are formed. Each through-void 34 extends depth-wise through the thickness dimension of the piezoelectric wafer W30. FIG. 8A shows a respective portion of the piezoelectric wafer W30. In step S001, the through-voids 34 are formed by etching (see FIG. 8B). While forming the through-voids 34, the electrode-extracting conductors 37 (which are respective parts of the edge surface of the through-voids 34) are formed simultaneously. Step S001 can be denoted as a step for forming the through-voids 34.

Next, in step S002 metal films 42 are formed on the main surfaces of the piezoelectric wafer W30 (see FIG. 8C). The metal films 42 comprise respective chromium layers formed on both main surfaces of the piezoelectric wafer W30, including the edge surfaces of the through-voids 34. The metal films 42 are fawned by first forming a layer of chromium, followed by forming a layer of gold on the chromium layers. Step S002 can be denoted as a step for forming the metal films.

Step S003 can be denoted as a step for forming photoresist layers (see FIG. 8D). The photoresist 43 is formed on the surfaces of the metal film 42 formed on first principal surface of the piezoelectric wafer W30 (see FIG. 8D). In the following, the photoresist 43 is referred to as a "positive" photoresist, in which the exposed portion is removed after development.

In step S004, the photoresist is exposed. For exposing the photoresist 43, a first mask 44a and second mask 44b are used. The first mask 44a is used to define electrodes on the first principal surface 38a as well as the electrode-extracting conductor 37, and the second mask 44b is used to define electrodes on the second principal surface 38b.

Figure 9A:
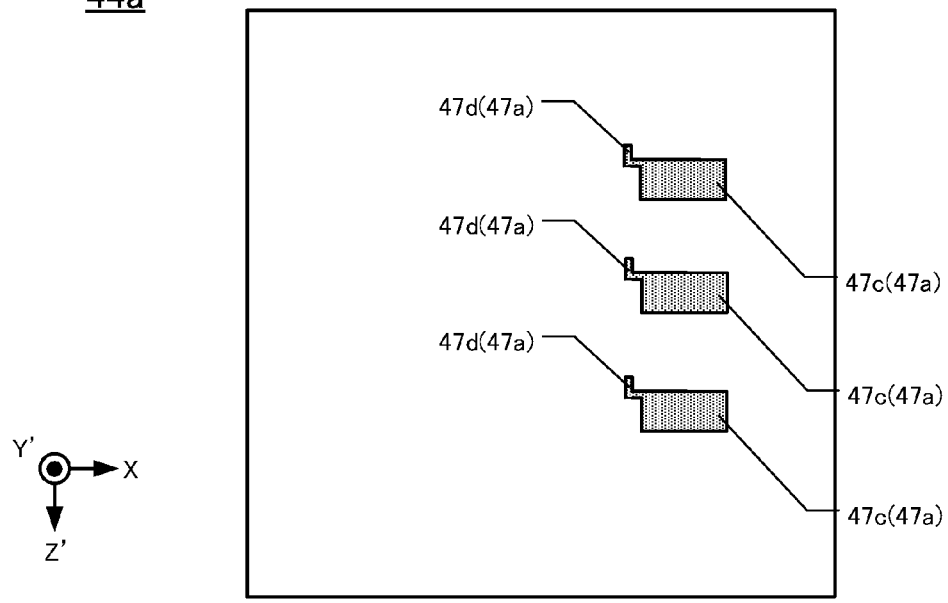
FIG. 9A is a schematic view of a first mask.

FIG. 9A is a schematic plan view of a first mask 44a defining three openings by way of example. Each opening defines a respective region that covers the first extraction electrode 36a previously formed on the first excitation electrode 35a, the first principal surface 38a, and the portion of the first extraction electrode 36a on the electrode-extracting conductor 37. In FIG. 9A, the region in which the mask is present is denoted as a "first mask region" 47a. The first mask region 47a comprises a region 47c covering the first excitation electrode 35a as well as a region 47d covering the first extraction electrode 36a (formed on the first extraction electrode 36a and the electrode-extraction conductor 37). To provide a clearer depiction, only three respective first mask regions 47a (corresponding to three piezoelectric substrates 30) are shown in FIG. 9A.

Figure 9B:
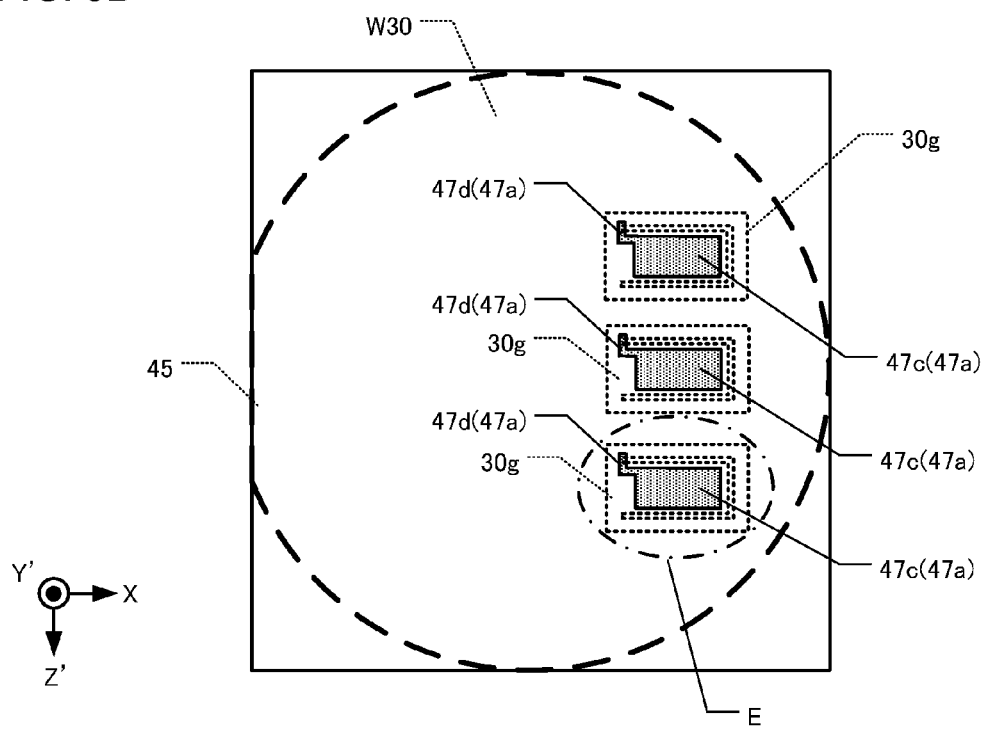
FIG. 9B is a schematic view of the first mask overlapping a piezoelectric wafer.

FIG. 9B schematically depicts the first mask 44a overlapping the piezoelectric wafer W30. The first mask 44a is disposed on the first principal surface 38a of the piezoelectric wafer W30. In FIG. 9B, the first mask 44a is denoted using a solid line, while the piezoelectric wafer W30 is denoted using a dashed line. To provide a clearer depiction, respective regions 30g (where three piezoelectric substrates 30 are formed) are denoted using dotted lines. The piezoelectric wafer W30 includes an orientation flat 45, which is used as a reference of the crystallographic direction of the piezoelectric wafer W30. The first mask 44a is disposed so that the region 47c overlaps the region in which the first excitation electrode 35a is formed. Also, the region 47d overlaps the region where the first extraction electrode 36a is formed on the first principal surface 38a. The region 47d also overlaps the region where the first extraction electrode 36a is formed on the electrode-extraction conductor 37 is formed.

Figure 10A:
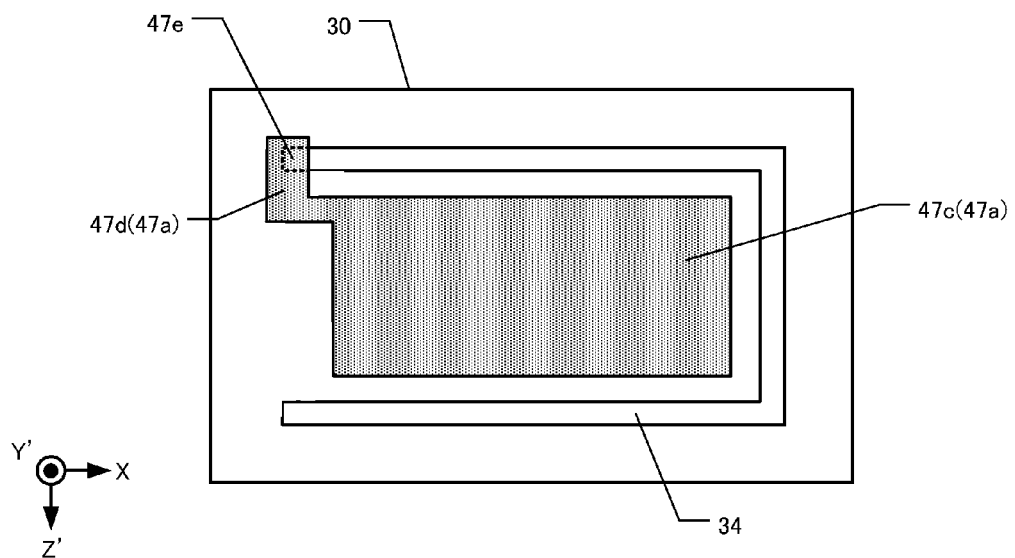
FIG. 10A is an enlargement of the region in FIG. 9B surrounded by a dot-dash line.

FIG. 10A is an enlarged view of the region "E" encircled by a dot-dash line in FIG. 9B. In FIG. 10A, a first mask region 47a is shown, located on the first principal surface 38a of the piezoelectric substrate 30. The piezoelectric substrate 30 defines a through-void 34. If the region corresponding to the first extraction electrode 36a (formed on the electrode-extracting conductor 37 of the first mask region 47a) only covers the upper portion of the electrode-extracting conductor 37 of the through-void 34, then exposure light including UV light) may be vertically incident on the first mask region 47a and thus may expose the portions of the first extraction electrode 36a formed on the electrode-extracting conductor 37. Also, if the first mask 47a becomes misaligned relative to the region 30g, the corresponding region of the first extraction electrode 36a (formed on the electrode-extracting conductor 37) may not be covered by the first mask region 47a. To avoid this situation, the region in which the first extraction electrode 36a is formed (on the electrode-extracting conductor 37 of the first mask region 47a) covers the edge of the through-void 34 of the electrode-extracting portion 37a (, three edges of the through-void). In FIG. 10A, this first mask region 47a is indicated as region 47e. The region 47e protects the first mask region 37a from exposure to light (including UV light) vertically incident to the first mask region 47a. The region 47e also protects the photoresist 43 (on the electrode-extracting conductor 37) from exposure due to misalignment of the first mask region 47a.

Figure 10B:
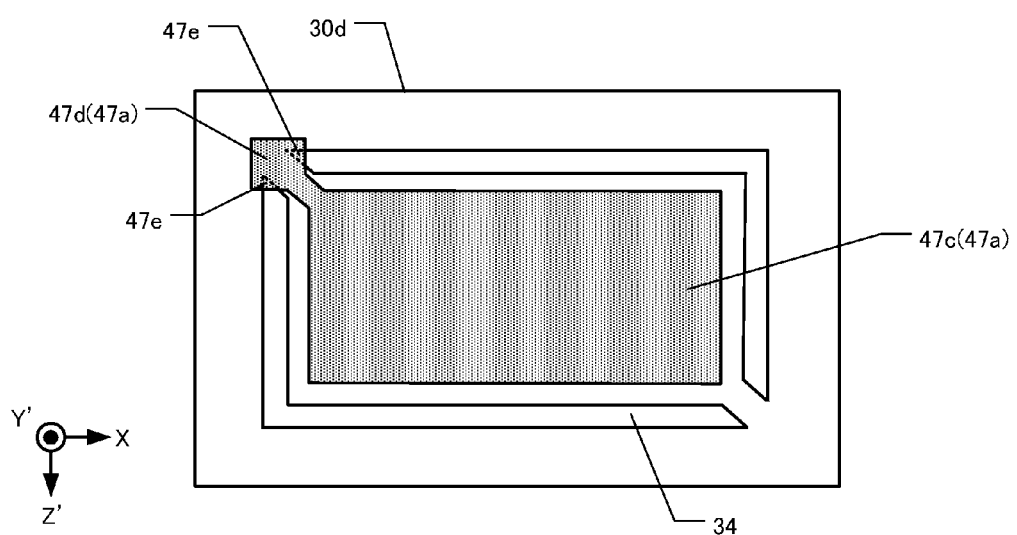
FIG. 10B is a plan view of a piezoelectric substrate formed on an upper main surface of the piezoelectric wafer.

FIG. 10B is a plan view of a piezoelectric substrate 30d, specifically on the upper principal surface of a piezoelectric wafer W30. The first mask region 47a on the piezoelectric substrate 30d covers the first excitation electrode 35a, the first extraction electrode 36a on the first principal surface 38a, and the first extraction electrode 36a on the electrode-extracting conductor 37. Similar to FIG. 10A, the first mask region 47a includes the region 47e atop the through-void 34, including the electrode-extracting conductor 37.

Figure 11A:
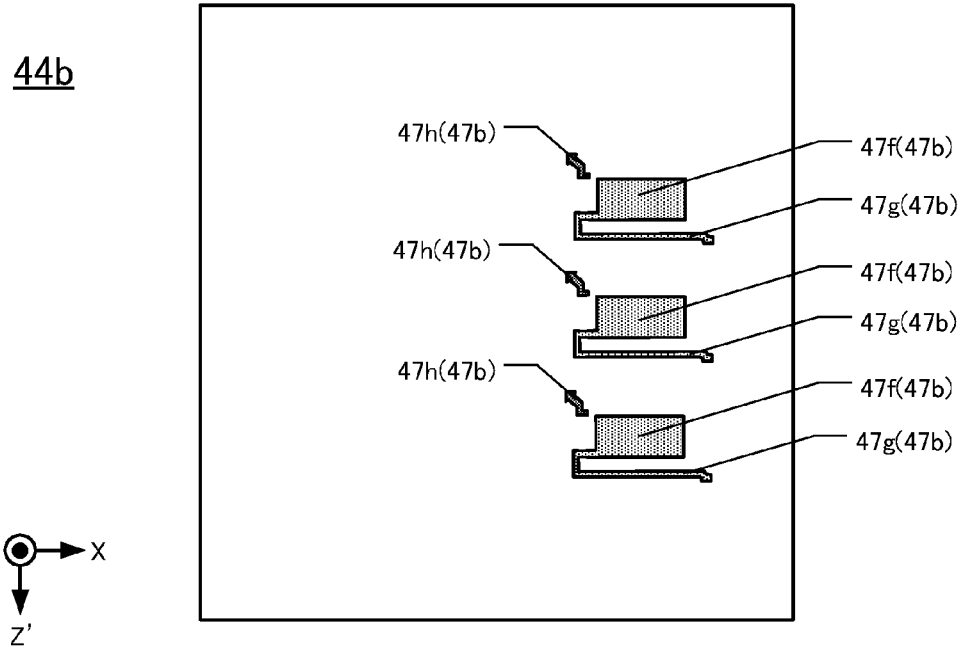
FIG. 11A is a schematic plan view of a second mask.

FIG. 11A is a schematic plan view of the second mask 44b. The second mask 44b covers the second extraction electrode 36b (on the second excitation electrode 35b), the second principal surface 38b, the first extraction electrode 36a (on the second principal surface 38b), and the first extraction electrode 36a (on the electrode-extracting conductor 37). In FIG. 11A, the region where the mask is formed is denoted the second mask region 47b. The second mask region 47b includes the region 47f (covering the second excitation electrode 35b), the region 47g (covering the second extraction electrode 36b on the second principal surface 38b), and the region 47h (of the first extraction electrode 36a formed on the second principal surface 38b and the first extraction electrode 36a formed on the electrode-extracting conductor 37). As shown in FIG. 10A, the region 47h includes the region 47e, which covers the entire through-void 34 including the electrode-extracting conductor 37. For simplicity, only three (3) second mask regions 47b are shown in FIG. 11A.

Figure 11B:
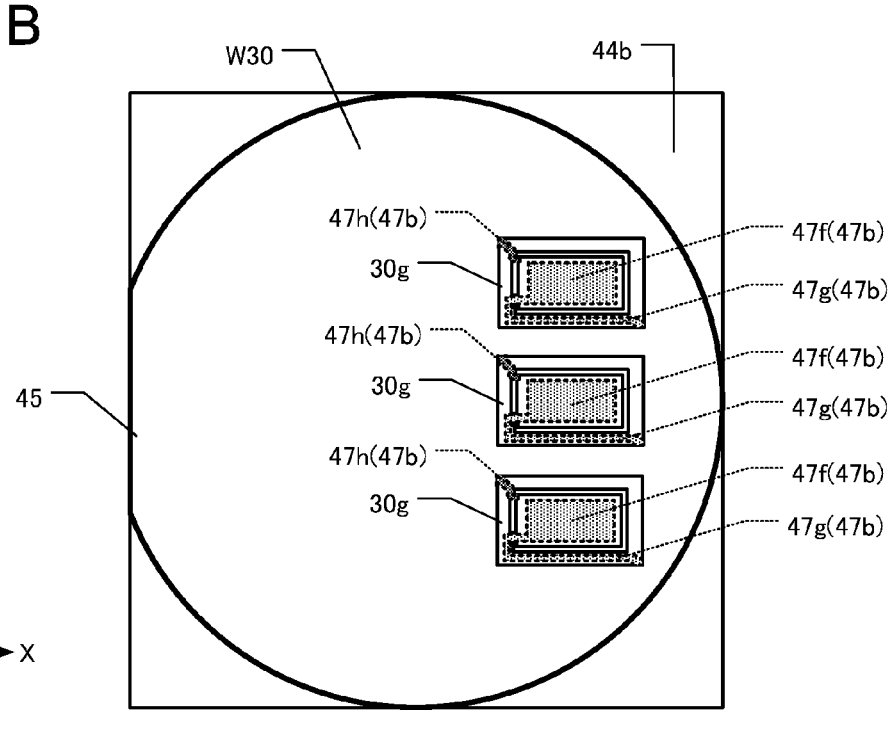
FIG. 11B is a schematic plan view of the second mask 44$b$ and the piezoelectric wafer W30 stacked together.

FIG. 11B is a schematic plan view of the second mask 44b aligned with the piezoelectric wafer W30. In FIG. 11B, the second mask 44b is disposed on the second principal surface 38b of the piezoelectric wafer W30. Also, the region 30g of each of three piezoelectric substrates 30 is shown, as indicated by a solid line. The second mask region 47b is denoted by a dotted line. The electrode formed on the second principal surface 38b of the piezoelectric substrate 30 is formed using the second mask 44b.

FIG. 8E shows the result of step S004 (the photoresist step). The first mask 44a is disposed on the +Y'-axis side of the piezoelectric wafer W30, and the second mask 44b is disposed on the −Y'-axis side of the piezoelectric wafer W30. Exposure light, including UV light, is irradiated (from the +Y'-axis side and the −Y'-axis side surfaces of the piezoelectric wafer W30) to expose the photoresist 43. The photoresist 43, which is not covered by the first mask 44a and/or the second mask 44b, is irradiated with exposure light (including UV light) for exposure and development. Also, the metal film 42 formed on the bottom layer of the developed photoresist 43 is removed. In FIG. 8E, the photoresist 43 on the metal film 42 (for removal and development) is denoted as the region 48. The metal film 42 (formed on the electrode-extracting conductor 37 and the photoresist 43) is not removed. FIG. 8F shows a situation after removing all the photoresist 43 from the piezoelectric wafer W30 after step S004. FIG. 8F shows a situation in which the piezoelectric substrates 30, indicated in FIG. 3A, have been formed on the piezoelectric wafer W30.

Although FIG. 8 depicts an exemplary use of positive photoresist, a negative photoresist 43 alternatively could be used as the photoresist 43. If a positive photoresist is used, the exposed region is removed after development. If a negative photoresist is used, the exposed region remains after development. Therefore, when a negative photoresist is used in the first mask region 44a and the second mask region 44b, an opening is formed on each region indicated on the first mask region 47a and the second mask region 47b. The remaining regions intercept exposure light.

INDUSTRIAL APPLICABILITY

Representative embodiments are described in detail above. As will be evident to those skilled in the relevant art, the present invention may be changed or modified in various ways within the technical scope thereof. For example, although an AT-cut quartz-crystal material was used as an example of the piezoelectric substrate 30, it will be understood that the embodiments can be applied with equal facility to BT-cut piezoelectric material that vibrates in a thickness-shear mode. Further, the piezoelectric substrate 30 can be made with equal facility of other piezoelectric materials such as lithium tantalite and lithium niobate. Furthermore, the present disclosure can be applied to piezoelectric oscillators that also include respective integrated circuits configured as oscillating circuits that are mounted inside the package on the package base.

What is claimed is:

1. A piezoelectric vibrating device, comprising:
    a piezoelectric substrate having first and second principal surfaces, the piezoelectric substrate including a rectangular vibrating piece surrounded by an outer frame, the vibrating piece having a first excitation electrode on its first principal surface and a second excitation electrode on its second principal surface, the piezoelectric substrate defining a through-void extending between the vibrating piece and the outer frame so as to separate, at least in part, the vibrating piece from the outer frame, the piezoelectric substrate further including at least one supporting portion extending between the vibrating piece and the outer frame, the supporting portion having a predefined width and extending from the outer frame to the vibrating piece to support the vibrating piece relative to the outer frame, the piezoelectric substrate further including first and second extraction electrodes extending from the first and second excitation electrodes, respectively, across the supporting portion to the outer frame;

a package lid having an outer main surface and an inner main surface, the inner main surface being bonded to the first principal surface of the outer frame; and a package base having an inner main surface and an outer main surface, the inner main surface being bonded to the second principal surface of the outer frame, and the outer main surface being a mounting surface by which to mount the device for use;

wherein, at least one extraction electrode extends from the first principal surface to the second principal surface via an edge surface of the through-void, the edge surface being located so as not to overlap the respective excitation electrode of the vibrating piece, as viewed from a direction along an edge of the rectangular vibrating piece.

2. The piezoelectric device of claim 1, wherein:
the outer frame has a rectangular plan profile;
the package base comprises at least two castellations located on an edge of the package base and extending between the inner and outer main surfaces, each castellation having a respective conductive electrode that is electrically connected to a respective extraction electrode; and
the outer main surface of the package base comprises at least two external electrodes each being electrically connected to the conductive electrode of a respective castellation.

3. The piezoelectric device of claim 2, wherein:
the supporting portion comprises a first supporting portion and a second supporting portion disposed separately from the first supporting portion and separated therefrom by a portion of the through-void; and
the first and second supporting portions are located on respective corners of the vibrating piece or on a first edge thereof.

4. The piezoelectric device of claim 2, wherein:
the supporting portion comprises a first supporting portion and a second supporting portion disposed separately from the first supporting portion and separated therefrom by a portion of the through-void; and
the first and second supporting portions are located on diagonally opposing corners of the rectangular vibrating piece.

5. The piezoelectric device of claim 2, wherein:
the outer frame has a width;
the through-void has a predefined width that is a minimum width that can be formed depth-wise by wet-etching from the first principal surface to the second principal surface; and
the width of the through-void is less than the width of the outer frame.

6. The piezoelectric device of claim 2, wherein:
the first external electrode extends from the first principal surface to the second principal surface via an edge surface of the through-void;
the second extraction electrode extends along the second principal surface to the outer frame; and
the first extraction electrode is shorter than the second extraction electrode.

7. The piezoelectric device of claim 1, wherein:
the supporting portion comprises a first supporting portion and a second supporting portion disposed separately from the first supporting portion and separated therefrom by a portion of the through-void; and
the first and second supporting portions are located on respective corners of the vibrating piece or on a first edge thereof.

8. The piezoelectric device of claim 7, wherein:
the outer frame has a width;
the through-void has a predefined width that is a minimum width that can be formed depth-wise by wet-etching from the first principal surface to the second principal surface; and
the width of the through-void is less than the width of the outer frame.

9. The piezoelectric device of claim 7, wherein:
the first external electrode extends from the first principal surface to the second principal surface via an edge surface of the through-void;
the second extraction electrode extends along the second principal surface to the outer frame; and
the first extraction electrode is shorter than the second extraction electrode.

10. The piezoelectric device of claim 1, wherein:
the supporting portion comprises a first supporting portion and a second supporting portion disposed separately from the first supporting portion and separated therefrom by a portion of the through-void; and
the first and second supporting portions are located on diagonally opposing corners of the rectangular vibrating piece.

11. The piezoelectric device of claim 10, wherein:
the outer frame has a width;
the through-void has a predefined width that is a minimum width that can be formed depth-wise by wet-etching from the first principal surface to the second principal surface; and
the width of the through-void is less than the width of the outer frame.

12. The piezoelectric device of claim 10, wherein:
the first external electrode extends from the first principal surface to the second principal surface via an edge surface of the through-void;
the second extraction electrode extends along the second principal surface to the outer frame; and
the first extraction electrode is shorter than the second extraction electrode.

13. The piezoelectric device of claim 1, wherein:
the outer frame has a width;
the through-void has a predefined width that is a minimum width that can be formed depth-wise by wet-etching from the first principal surface to the second principal surface; and
the width of the through-void is less than the width of the outer frame.

14. The piezoelectric device of claim 13, wherein:
the first external electrode extends from the first principal surface to the second principal surface via an edge surface of the through-void;
the second extraction electrode extends along the second principal surface to the outer frame; and
the first extraction electrode is shorter than the second extraction electrode.

15. The piezoelectric device of claim 1, wherein:
the first external electrode extends from the first principal surface to the second principal surface via an edge surface of the through-void;
the second extraction electrode extends along the second principal surface to the outer frame; and
the first extraction electrode is shorter than the second extraction electrode.

16. The piezoelectric device of claim 1, wherein:
the second extraction electrode extending from the second excitation electrode on the second principal surface to the second principal surface of the outer frame is not formed on an edge surface of the through-void.

\* \* \* \* \*